United States Patent
Agostini et al.

(10) Patent No.: US 9,909,817 B2
(45) Date of Patent: Mar. 6, 2018

(54) COOLING ELEMENT

(71) Applicant: ABB Technology Oy, Helsinki (FI)

(72) Inventors: Francesco Agostini, Zofingen (CH); Daniele Torresin, New Berlin, WI (US); Mathieu Habert, Baden Daettwil (CH); Bruno Agostini, Baden Daettwil (CH)

(73) Assignee: ABB Technology Oy, Helsinki (FI)

( * ) Notice: Subject to any disclaimer, the term of this patent is extended or adjusted under 35 U.S.C. 154(b) by 186 days.

(21) Appl. No.: 14/825,952

(22) Filed: Aug. 13, 2015

(65) Prior Publication Data

US 2016/0054074 A1     Feb. 25, 2016

(30) Foreign Application Priority Data

Aug. 19, 2014   (EP) .................................... 14181392

(51) Int. Cl.
*F28D 15/00*    (2006.01)
*F28D 15/04*    (2006.01)
(Continued)

(52) U.S. Cl.
CPC ....... *F28D 15/043* (2013.01); *F28D 15/0233* (2013.01); *F28D 15/0266* (2013.01);
(Continued)

(58) Field of Classification Search
CPC .. F28D 15/03; F28D 15/0233; F28D 15/0266; F28D 1/035; F28F 1/022;
(Continued)

(56) References Cited

U.S. PATENT DOCUMENTS 5,738,168 A *  4/1998  Patel ...................... F28F 1/325
                                                      165/151
8,919,426 B2* 12/2014  Hardesty ................ F28D 1/035
                                                      165/104.21
(Continued)

FOREIGN PATENT DOCUMENTS

CN          201438058 U      4/2010
EP          2327947 A1       6/2011
(Continued)

OTHER PUBLICATIONS

European Patent Office, European Search Report issued in Patent Application No. 14183923.3 dated Jan. 28, 2015, 7 pp.

*Primary Examiner* — Davis Hwu
(74) *Attorney, Agent, or Firm* — Taft Stettinius & Hollister LLP

(57) ABSTRACT

The invention relates to a cooling element (11) comprising: a fluid channel (1) providing a pulsating heat pipe, a first evaporator (14) for receiving heat from electric components (15) and for passing the heat into fluid in the fluid channel (1), and a first condenser (18) for receiving fluid from the first evaporator (14) via the fluid channel (1) and for cooling fluid in the fluid channel. In order to obtain an even temperature distribution at the first evaporator (14) an adiabatic zone where the temperature of the fluid in the fluid channel (1) remains unchanged or a cooling zone, with a second condenser (20) cooling fluid in the fluid channel (1), separates the first evaporator (14) from the loops (6) in the second end (12) of the fluid channel.

11 Claims, 6 Drawing Sheets

(51) Int. Cl.
 *F28D 15/02* (2006.01)
 *F28F 9/02* (2006.01)
 *H01L 23/427* (2006.01)
 *F28F 1/02* (2006.01)
 *H05K 7/20* (2006.01)

(52) U.S. Cl.
 CPC ............ *F28F 1/022* (2013.01); *F28F 9/0278* (2013.01); *H01L 23/427* (2013.01); *H05K 7/20336* (2013.01); *H01L 2924/0002* (2013.01)

(58) Field of Classification Search
 CPC ................. F28F 9/0278; H01L 23/427; H01L 2924/0002; H05K 7/20336; F25B 23/006
 USPC ...................................................... 165/104.26
 See application file for complete search history.

(56) References Cited

U.S. PATENT DOCUMENTS

| 2009/0200006 | A1* | 8/2009 | Kroliczek | ............. | F25B 23/006 |
| | | | | | 165/274 |
| 2014/0174086 | A1* | 6/2014 | Kare | ....................... | F01K 11/00 |
| | | | | | 60/670 |

FOREIGN PATENT DOCUMENTS

| EP | 2444770 A1 | 4/2012 |
| WO | 2014/202474 A1 | 12/2014 |

* cited by examiner

COOLING ELEMENT

BACKGROUND OF THE INVENTION

Field of the Invention

This invention relates to a cooling element, and in particular to a cooling element for multiple electric devices which has a fluid channel arrangement providing a pulsating heat pipe behavior.

Description of Prior Art

Previously there is known a cooling element with a flow channel having a meandering shape comprising a plurality of parallel fluid channel sections which are interconnected with loops. An evaporator receives heat from electric components and passes the heat to the fluid channel. A condenser cools fluid received from the evaporator via the fluid channel.

During operation a temperature gradient prevails between the evaporator and the condenser, causing unstable pressure conditions. Heat passed to the fluid by the evaporator causes bubbles in the fluid channel sections to grow continuously. This pushes the fluid column in the fluid channel sections toward the condenser. Simultaneously, the cooling at the condenser further enhances the pressure difference between the opposite ends of the cooling element. In this way the unstable pressure conditions are formed.

Due to the loops interconnecting the fluid channel sections the motion of fluid slugs and vapor bubbles in one fluid channel section also leads to motion of slugs and bubbles in the next fluid channel section towards the evaporator (high-temperature). The inter-play between the driving force and the restoring force leads to oscillation of the vapor bubbles and fluid slugs.

A problem with the above described cooling element is that practical tests have shown that the temperature distribution at different parts of the evaporator is uneven.

SUMMARY OF THE INVENTION

An object is to solve the above mentioned drawback and to provide a cooling element with improved cooling properties. This and other objects are solved with a cooling element according to independent claims 1 and 7.

The use of an adiabatic zone or a cooling zone which separates the first evaporator from the loops in the second end of the cooling element leads to a cooling element design where no additional heat is transferred to the fluid in the fluid channel in the zone closest to the loops in the second end of the cooling element. Due to this it can be avoided that vapor bubbles accumulate in the loops in the second end of the cooling element. Because of the lack of a preferential flow direction in a pulsating heat pipe, the heating components can be distributed freely over the area of the first evaporator. This gives flexibility in the design.

Preferred embodiments of the invention are disclosed in the dependent claims.

BRIEF DESCRIPTION OF DRAWINGS

In the following the present invention will be described in closer detail by way of example and with reference to the attached drawings, in which.

DESCRIPTION OF AT LEAST ONE EMBODIMENT

Figure 1:
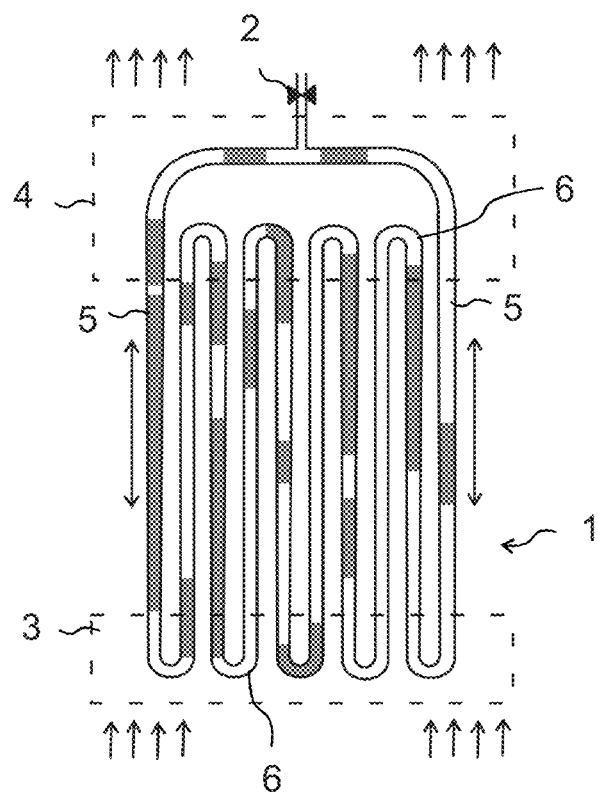
FIGS. 1 and 2 illustrate the working principle of a pulsating heat pipe.
Figure 2:
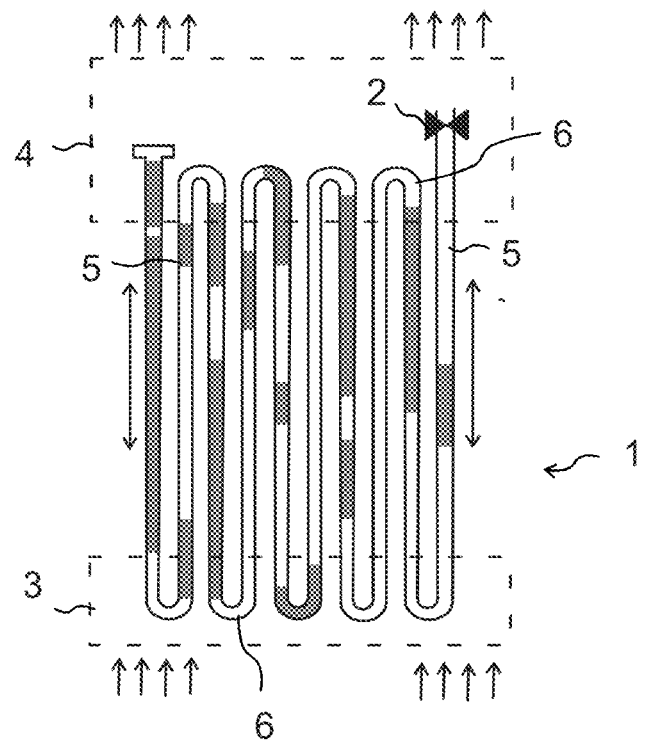

FIGS. 1 and 2 illustrate the working principle of a Pulsating Heat Pipe. FIG. 1 illustrates a closed-loop PHP and FIG. 2 illustrates an open-loop PHP.

A pulsating heat pipe involves a meandering fluid channel 1 having a capillary dimension, in other words a cross-section small enough for capillary forces to dominate over gravity forces. As illustrated in FIGS. 1 and 2, the fluid channel 1 comprises a plurality of substantially parallel fluid channel sections 5, which are interconnected by loops 6 in a first (upper) and second (lower) end. In this connection the term "substantially parallel" refers to the fact that in many practical implementations the fluid channel sections are parallel due to practical reasons. However, it is not essential that the fluid channel sections are exactly parallel, as a pulsating heat pipe is also obtained with fluid channel sections that are not exactly parallel with each other.

The diameter of a fluid channel 1 which is considered capillary depends on the fluid that is used (boiling) inside. The following formula, for instance, can be used to evaluate a suitable diameter:

$$D = (sigma/(g*(rhol - rhov)))^{\wedge}0.5,$$

wherein sigma is the surface tension, g the acceleration of gravity, rhov the vapor density and rhol the liquid density. This formula gives values from 1 to 3 mm for R134a (Tetrafluoroethane), R245fa and R1234ze (Tetrafluoropropene), which are fluids suitable for use in pulsating heat pipes.

A suitable fluid can be introduced into the fluid channel 1 via a filling valve 2. As a consequence, the fluid is moved by pulsations generated by pressure instabilities. The oscillations occur in a small channel loop due to the bidirectional expansion of vapor inside the channels. During operation, the liquid slugs and elongated vapor bubbles will oscillate between a cold and a hot region because of hydrodynamic instabilities caused by the rapid expansion of the bubbles confined in the small channels, and thus provide a fluid velocity almost independent of gravity. This makes pulsating heat pipes fairly insensitive to orientation, with the possibility of operating them "upside down", i.e. with an evaporator on top and a condenser at the bottom. In FIGS. 1 and 2 the Pulsating Heat Pipes are, however, by way of example illustrated in a position where the evaporator 3 is at the bottom and the condenser 4 at the top.

An advantage of utilizing a pulsating heat pipe in a cooling element is that the cooling element can be utilized in any orientation without causing problems for fluid circulation within the cooling element.

Figure 3:
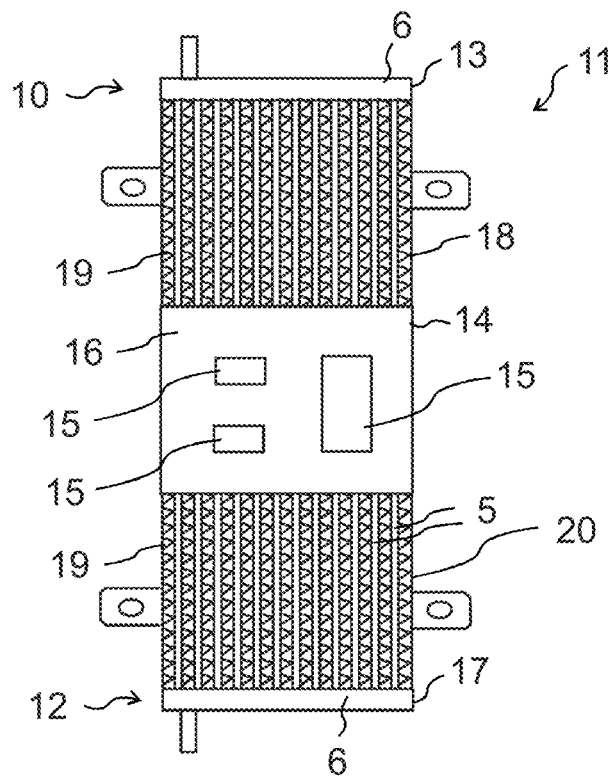
FIG. 3 illustrates a first embodiment of a cooling element.

FIG. 3 illustrates a first embodiment of a cooling element 11. Such a cooling element may be utilized in a motor drive, such as in a frequency converter controlling feed of electricity to an electric motor, for instance. The cooling element 11 comprises a fluid channel with a capillary dimension and a meandering shape comprising a plurality of substantially parallel fluid channel sections 5 which are interconnected by loops 6 in a first end 10 and a second end 12 of the cooling element in order to provide a pulsating heat pipe. The fluid channel may be implemented as a single tube bent into the meandering shape illustrated in FIGS. 1 and 2, for instance, or alternatively by utilizing tubes with a plurality of fluid channel sections in combination with corresponding fluid distribution elements, as will be explained in more detail in connection with FIGS. 7 to 12. The pulsating heat pipe may be of the closed type as illustrated in FIG. 1 or alternatively of the open type as illustrated in FIG. 2. In FIG. 3 the loops 6 are arranged in fluid distribution elements 13 and 17 in the first 10 and second end 12 of the cooling element.

A first evaporator 14 is arranged to receive heat from electric components 15 and for passing the heat into fluid in the fluid channel. In the illustrated example the first evaporator 14 comprises a plate with a first surface 16 for receiving heat from one or more electric components 15, and a second surface, which is opposite to the first surface 16, for thermally connecting the walls of the substantially parallel fluid channel sections 5 to the plate.

The cooling element 11 also comprises a first condenser 18 for receiving fluid from the first evaporator 14 via the fluid channel and for cooling fluid in the fluid channel. The first condenser 18 separates the first evaporator 14 from the loops 6 in the first end 10 (upper end) of the cooling element. Consequently, the first condenser 18 is arranged between the evaporator 14 and the loops 6 in the first end of the cooling element. In the example illustrated in FIG. 3 the first condenser 18 has been implemented as fins 19 extending between walls of the substantially parallel fluid channel sections 5 and which dissipate heat into surrounding air.

The cooling element 11 illustrated in FIG. 1 comprises a cooling zone with a second condenser 20 which cools fluid in the fluid channel and which separates the first evaporator 14 from the loops 6 in the second end 12 of the cooling element 11. Consequently, no additional heat is transferred to the fluid in the fluid channel in this zone closest to the loops 6 in the second end 12, which prevents accumulation of vapor bubbles in the loops 6 of the second end and an uneven temperature distribution at the first evaporator 14. Similarly as the first condenser 18, also the second condenser 20 may be implemented as fins 19 extending between walls of the substantially parallel fluid channel sections 5 and which dissipate heat into surrounding air. The second condenser 20 may be of the same size as the first condenser 18. Excellent results will be obtained when the size (length) of the cooling zone is such that it is at least 5%, preferably at least 10% of the length of the substantially parallel fluid channel sections 5.

Figure 4:
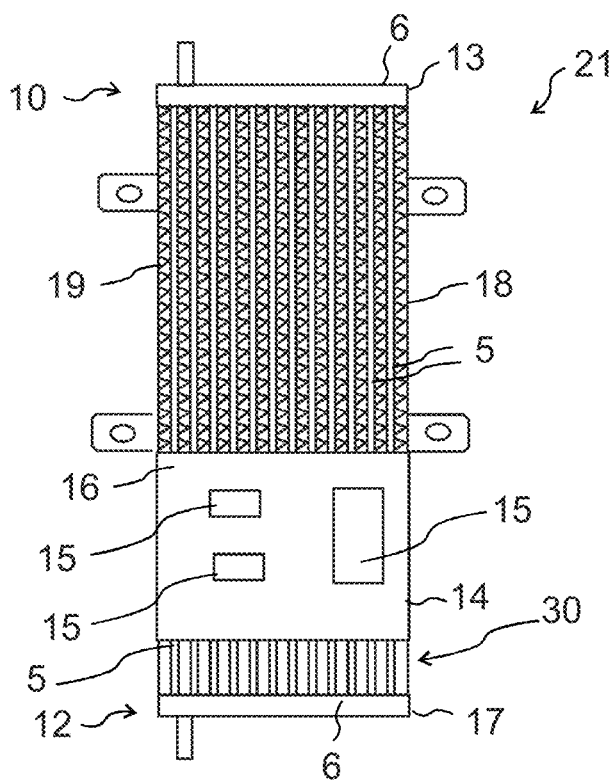
FIG. 4 illustrates a second embodiment of a cooling element.

FIG. 4 illustrates a second embodiment of a cooling element. The embodiment of FIG. 4 is very similar to the one explained in connection with FIG. 3. Therefore the embodiment of FIG. 4 will in the following be mainly explained by pointing out the differences between these embodiments.

The cooling element 21 of FIG. 4 has an adiabatic zone 30 which separates the first evaporator 14 from the loops in the second end of the cooling element. In this adiabatic zone 30 the temperature of the fluid in the fluid channel remains unchanged. This may be achieved as illustrated in FIG. 4, where the substantially parallel fluid channel sections 5 extend through the adiabatic zone 30 such that there is no thermal contact between their walls and any fins or evaporators. Similarly as in the embodiment of FIG. 3, no additional heat is transferred to the fluid in the fluid channel in this zone closest to the loops 6 in the second end 12, which prevents accumulation of vapor bubbles in the loops 6 of the second end and an uneven temperature distribution at the first evaporator 14. The length of the adiabatic zone 30 may be shorter than the length of the condenser 18 measured in the direction of the channel sections 5. Excellent results will be obtained when the size (length) of the adiabatic zone is such that it is at least 5%, preferably at least 10% of the length of the substantially parallel fluid channel sections 5.

Figure 5:
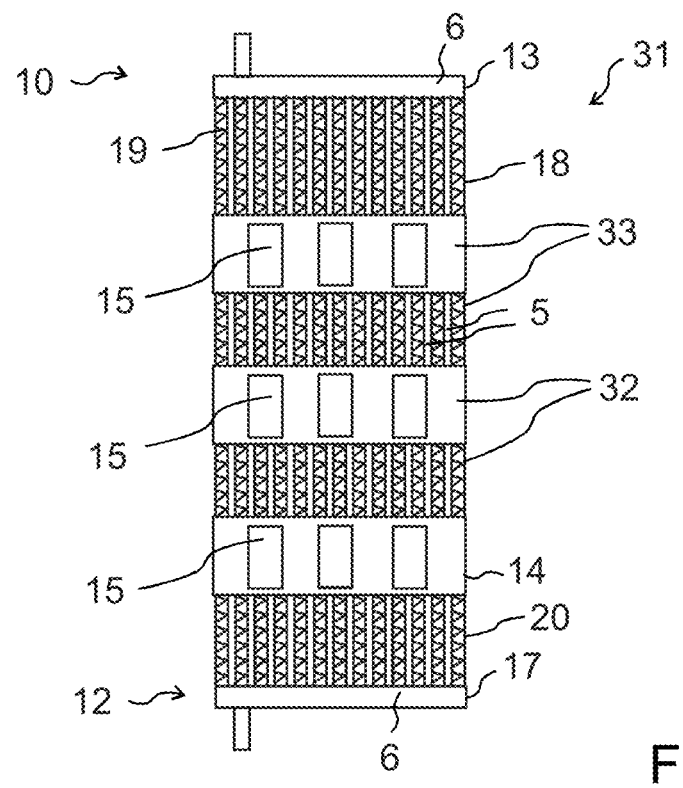
FIG. 5 illustrates a third embodiment of a cooling element.

FIG. 5 illustrates a third embodiment of a cooling element. The embodiment of FIG. 5 is very similar to the one explained in connection with FIG. 3. Therefore the embodiment of FIG. 5 will in the following be mainly explained by pointing out the differences between these embodiments.

In FIG. 5, the first evaporator 14 is separated from the first condenser 18 by at last a first additional condenser-evaporator pair 32 in which the condenser, similarly as the first condenser 18, cools fluid in the fluid channel and the evaporator, similarly as the first evaporator 14, receives heat from electric components 15 and passes the heat into fluid in the fluid channel. In the illustrated embodiment, the cooling element comprises additionally a second additional condenser-evaporator pair 33 implemented similarly, as the first additional condenser-evaporator pair 32. It is also possible to utilize even further additional condenser-evaporator pairs, though not illustrated in the Figure.

Instead of having a cooling zone with a second condenser 20 separating the first evaporator 14 from the loops 6 in the second end 12 of the cooling element 31, an adiabatic zone may be utilized, as explained in connection with FIG. 4.

Figure 6:
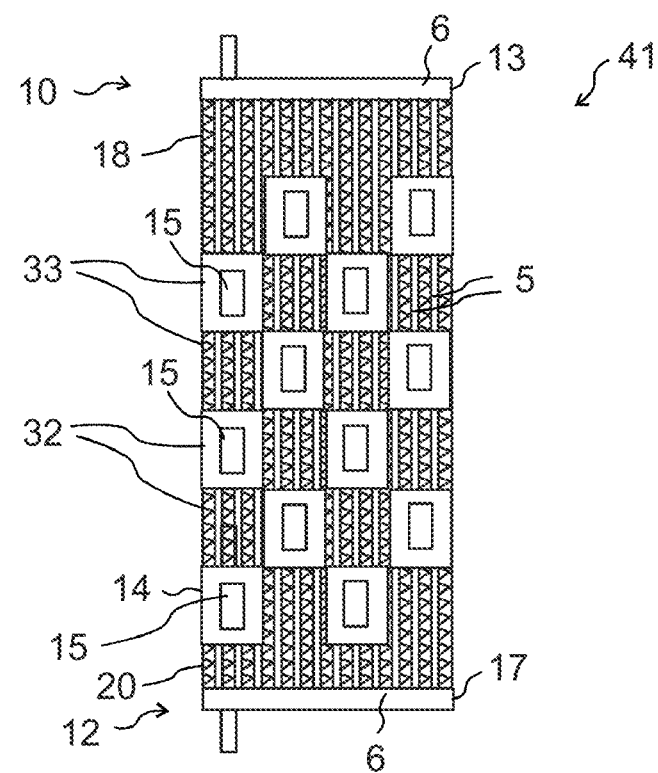
FIG. 6 illustrates a fourth embodiment of a cooling element.

FIG. 6 illustrates a fourth embodiment of a cooling element. The embodiment of FIG. 6 is very similar to the one explained in connection with FIG. 5. Therefore the embodiment of FIG. 6 will in the following be mainly explained by pointing out the differences between these embodiments.

FIG. 6 illustrates a staggered configuration with a plurality of relatively narrow evaporators arranged to the cooling element 41. In the illustrated example, the width of each evaporator is smaller than the width of the cooling element. Consequently, in one row there is room for more than one evaporator.

Similarly as in the embodiment of FIG. 5, the first evaporator 14 is separated from the first condenser 18 by at last a first additional condenser-evaporator pair 32 in which the condenser, similarly as the first condenser 18, cools fluid in the fluid channel and the evaporator, similarly as the first evaporator 14, receives heat from electric components 15 and passes the heat into fluid in the fluid channel. In the illustrated embodiment, the cooling element 41 comprises additionally a second additional condenser-evaporator pair 33 implemented similarly, as the first additional condenser-evaporator pair 32. It is also possible to utilize even further additional condenser-evaporator pairs, though not illustrated in the Figure.

Figure 7:
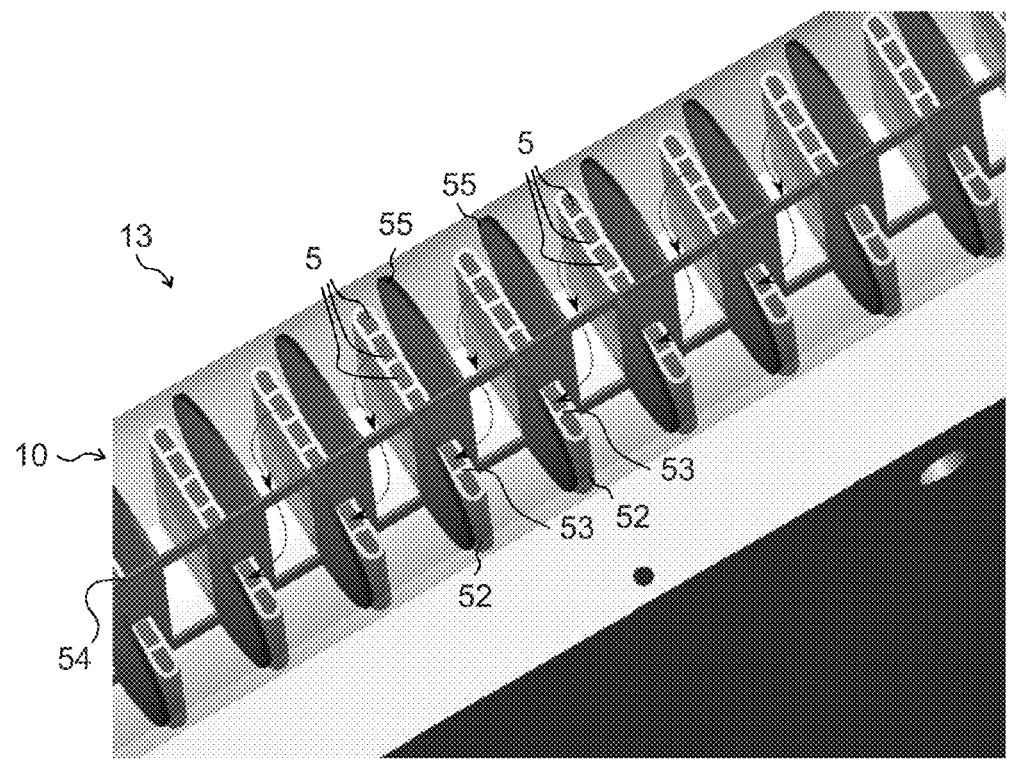
FIGS. 7 to 9 illustrate fluid distribution elements.
Figure 8:
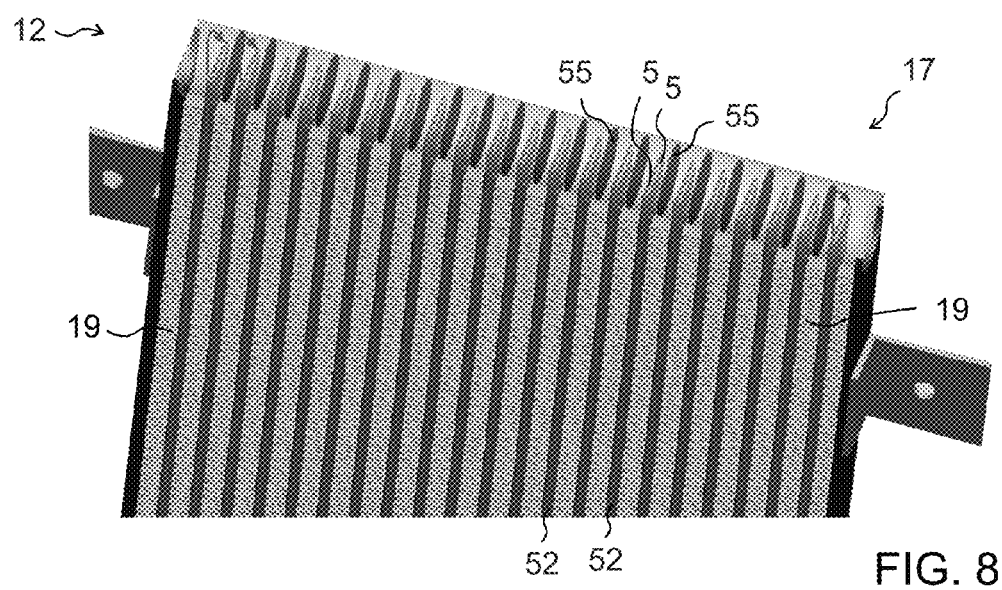
Figure 9:
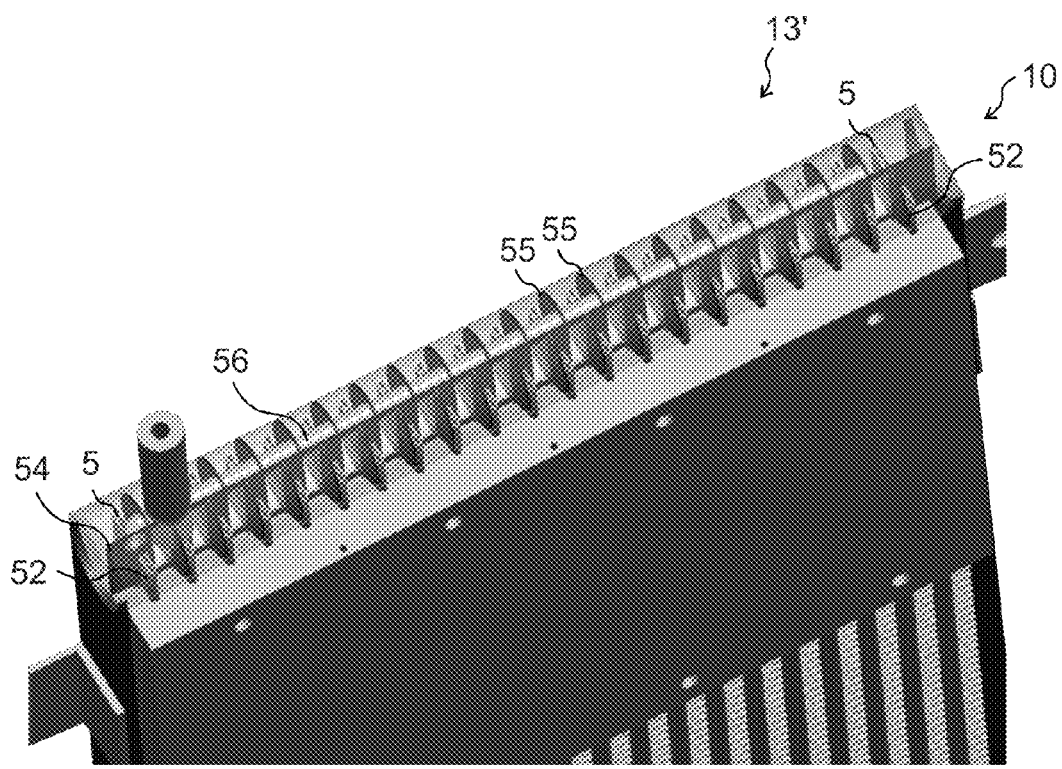

FIGS. 7 to 9 illustrate fluid distribution elements which can be utilized in the cooling elements of FIGS. 1 to 6 if the substantially parallel fluid channel sections are implemented in these embodiments with tubes 52, as illustrated in FIGS. 7 to 9.

In FIGS. 7 to 9 the cooling element comprises a plurality of tubes 52 having internal longitudinal walls 53 which separate substantially parallel fluid channel sections 5 from each other. Fins 19 may be utilized in the condensers between the tubes 52 such that the fins extend between walls of the substantially parallel fluid channel sections 5 for dissipating heat into surrounding air.

The loops 6 in the first end 10 of the cooling element may be implemented with a fluid distribution element 13 as illustrated in FIG. 7, and the loops in the second end 12 of the cooling element may be implemented with a fluid distribution element 17 as illustrated in FIG. 8.

In FIG. 7 a separation element 54 with partition walls 55 is utilized. This separation element 54 which may be utilized in a first end 10 of a cooling element, directs fluid flowing upwards via fluid channel sections 5 of a first tube 52 to specific fluid channel sections 5 of a neighboring tube 52 (the one to the left from the original one) from where the fluid flows downwards. Alternatively, depending on the state of the Pulsating Heat Pipe, the flow direction may be opposite. FIG. 7 does not illustrate a cover which is shown in FIG. 3, for instance, which fluid tightly encloses the ends of the tubes 52 and the separation element 54 such that fluid can flow between the fluid channel sections 5 only in the above described way.

The fluid distribution element 17 of FIG. 8, which may be utilized in a second end 12 of a cooling element is also provided with separation walls 55. These separation walls 55 are arranged such that they prevent fluid communication between fluid channel sections 5 of different tubes 52. Consequently, any fluid arriving to the fluid distribution element 17 via fluid channel sections 5 of a specific tube 52 is forwarded via fluid channel sections of the same tube 52. FIG. 8 does not illustrate a cover which is shown in FIG. 3, for instance, which fluid tightly encloses the ends of the tubes 52 and the separation walls 55 such that fluid can flow between the fluid channel sections 5 only in the above described way.

If a fluid channel section 13 as illustrated in FIG. 7 is used in a first end 10 of a cooling element, and a fluid channel section 17 as illustrated in FIG. 8 is used in a second end 12 of a cooling element, the cooling element will have a fluid channel working as an open-loop Pulsating Heat Pipe, as explained in connection with FIG. 2.

However, if it is desirable to obtain a cooling element with a fluid channel working as a closed-loop Pulsating Heat Pipe, then the fluid distribution element 13' illustrated in FIG. 9 may be used in the first end 10 of the cooling element, while the fluid distribution element 17 illustrated in FIG. 8 may be utilized in the second end 12 of the cooling element.

The fluid distribution element 13' of FIG. 9 is similar as the one illustrated in FIG. 7, except for one additional pipe 56, which connects the fluid channel sections 5 of the tube 52 located most to the left in FIG. 9 with channel sections 5 of the tube 52 located most to the right in FIG. 9.

Figure 10:
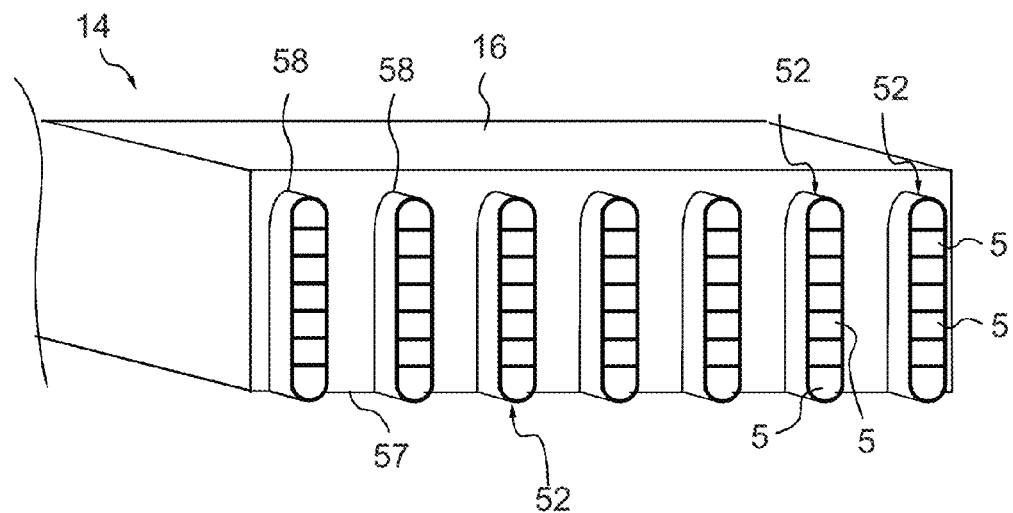
FIG. 10 illustrates an evaporator.

FIG. 10 illustrates an evaporator. The illustrated evaporator may be utilized as the first evaporator 14, for instance, in the cooling elements of FIGS. 1 to 6 if the substantially parallel fluid channel sections 5 are implemented in these embodiments with tubes 52, as illustrated in FIGS. 7 to 10.

The first evaporator 14 comprises a plate with a first surface 16 for receiving heat from one or more electric components, and a second surface 57 which is opposite to the first surface 16 for thermally connecting the walls of the substantially parallel fluid channel sections 5 to the plate.

In the illustrated example the second surface 57 of the plate is provided with grooves 58 into which the substantially parallel fluid channel sections 5 protrude for thermally connecting the walls of the substantially parallel fluid channel sections 5 to the plate of the evaporator 14. In the illustrated embodiment every fluid channel section 5 of each tube 52 is located within the plate, as the tubes 52 are illustrated to protrude entirely into the grooves 58. This is an advantageous solution for ensuring heat may pass as easily as possible from the plate to the fluid in the fluid channel sections 5. However, there may exist embodiments where it is not necessary that each tube 52 is located completely within the plate of the evaporator 14.

Figure 11:
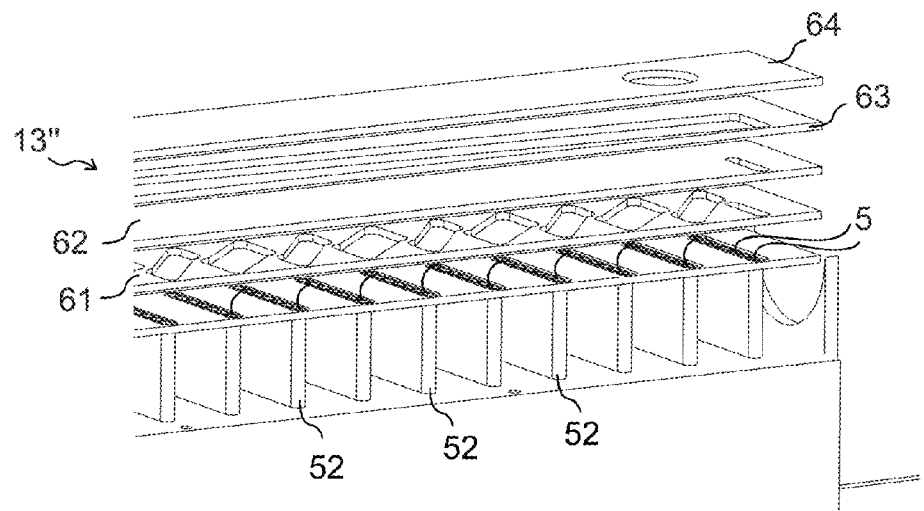
FIGS. 11 to 12 illustrate alternative fluid distribution elements.
Figure 12:
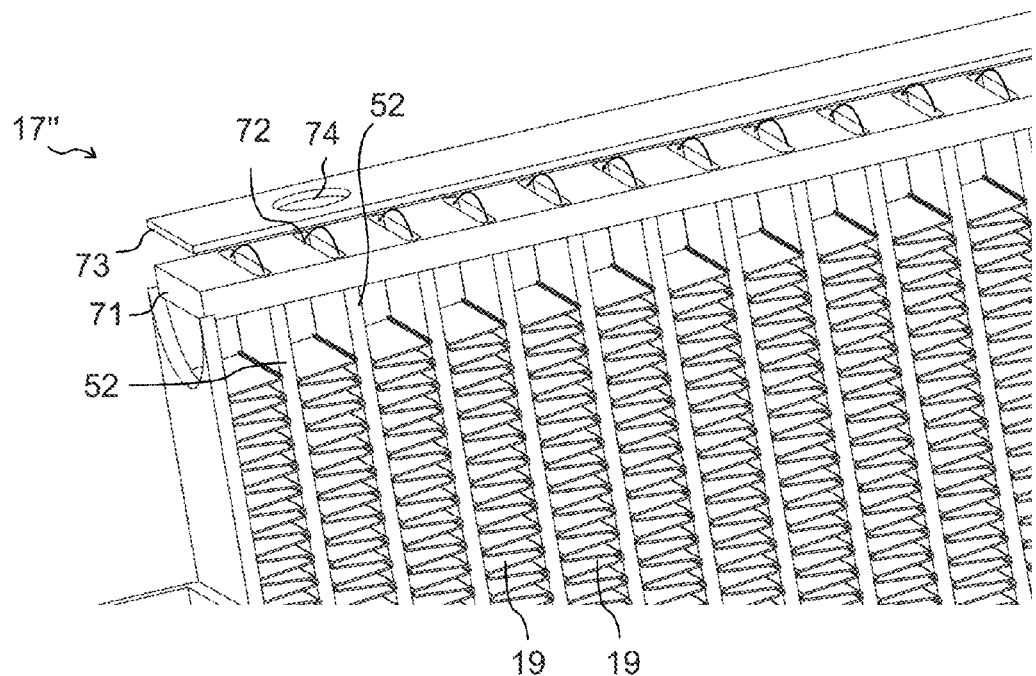

FIGS. 11 to 12 illustrate alternative fluid distribution elements. The embodiments of FIGS. 11 and 12 are very similar as the one explained in connection with FIGS. 9 and 8. Therefore the embodiment of FIGS. 11 to 12 is in the following mainly described by pointing out the differences between these embodiments.

In FIGS. 11 and 12 the fluid distribution elements are implemented by plates, which are perforated to have holes in correct locations in order to obtain the desired flow between the substantially parallel fluid channel sections 5 of the tubes 52.

FIG. 11 illustrates a fluid distribution element 13" for use in a first end 10 of a cooling element in order to obtain a fluid channel working as a closed-loop Pulsating Heat Pipe. A first 61 and a second plate 62 ensure that correct fluid channel sections 5 of each tube 52 are connected to correct fluid channel sections 5 of a neighboring tube 52. Plate 62 also has openings in its opposite ends (only one end shown) such that this plate together with plate 63 provides a channel allowing flow between the fluid channel sections 5 of the tube 52 located most to the left and the tube located most to the right in FIG. 11. Finally a top plate 64 works as a lid enclosing the loops of the fluid channel within the fluid distribution element 13". In this example the top plate 64 is provided with a hole, which may lead to a filling valve that can be used to fill the cooling element with fluid.

In case the intention is to obtain a cooling element with a fluid channel working as an open-loop Pulsating Heat Pipe, plate 63 of FIG. 11 may be left out, in which case fluid flow between fluid channel sections 5 of the outermost tubes 52 (the one located most to the left and the one located most to the right) is prevented.

FIG. 12 illustrates a fluid distribution element 17" for use in a second end 12 of a cooling element. Similarly as in the embodiment of FIG. 8 the fluid distribution element 17" prevents fluid communication between fluid channel sections of different tubes 52. Consequently, any fluid arriving to the fluid distribution element 17" via fluid channel sections of a specific tube 52 is forwarded via fluid channel sections of the same tube 52. In the embodiment of FIG. 12 this has been achieved by utilizing a first plate 71 with grooves 72 into which the ends of the tubes 52 protrude, and which allow fluid communication between the different fluid channel sections of each tube 52. A second plate 73, which is solid except for a hole 74, is fluid tightly arranged against the first plate 71 to prevent fluid from leaking out of the grooves 72 in the first plate 71. The hole 74 is not necessary in all embodiments, but it may be used for connection to a filling valve that can be used to fill the cooling element with fluid.

It is to be understood that the above description and the accompanying figures are only intended to illustrate the present invention. It will be obvious to a person skilled in the art that the invention can be varied and modified without departing from the scope of the invention.

The invention claimed is:

1. A cooling element comprising:
   a fluid channel with a capillary dimension and a meandering shape comprising a plurality of substantially parallel fluid channel sections which are interconnected by loops in a first and a second end of the cooling element for providing a pulsating heat pipe,
   a first evaporator for receiving heat from electric components and for passing the heat into fluid in the fluid channel, the first evaporator comprises a plate with a first surface for receiving heat from one or more electric components, and with a second surface, which is opposite to the first surface, having grooves into which the substantially parallel fluid channel sections protrude for thermally connecting the walls of the substantially parallel fluid channel sections to the plate, a first condenser for receiving fluid from the first evaporator via the fluid channel and for cooling fluid in the fluid channel, the first condenser separating the first evaporator from the loops in the first end of the cooling element, and a cooling zone with a second condenser cooling fluid in the fluid channel separates the first evaporator from the loops in the second end of the fluid channel.

2. The cooling element according to claim 1, wherein the first condenser and second condenser consists of fins extending between walls of the substantially parallel fluid channel sections for dissipating heat into surrounding air.

3. The cooling element according to claim 1, wherein the first evaporator is separated from the first condenser by at least a first additional condenser-evaporator pair in which the condenser cools fluid in the fluid channel and the evaporator receives heat from electric components and passes the heat into fluid in the fluid channel.

4. The cooling element according to claim 1, wherein the cooling element comprises
a plurality of tubes having internal longitudinal walls which separate substantially parallel fluid channel sections from each other, and
a first fluid distribution element in a first end of the cooling element and a second fluid distribution element in a second end of the cooling element for providing the loops interconnecting predetermined ones of the substantially parallel fluid channel sections to each other in order to obtain a fluid channel with a meandering shape.

5. The cooling element according to claims 4, wherein the tubes are extruded multiport tubes with parallel internal longitudinal walls separating the substantially parallel fluid channels sections from each other.

6. The cooling element according to claim 1, wherein the first evaporator is separated from the first condenser by at least a first additional condenser-evaporator pair in which the condenser cools fluid in the fluid channel and the evaporator receives heat from electric components and passes the heat into fluid in the fluid channel; and
wherein the first condenser and second condenser consists of fins extending between walls of the substantially parallel fluid channel sections for dissipating heat into surrounding air.

7. The cooling element according to claim 2, wherein the cooling element comprises
a plurality of tubes having internal longitudinal walls which separate substantially parallel fluid channel sections from each other, and
a first fluid distribution element in a first end of the cooling element and a second fluid distribution element in a second end of the cooling element for providing the loops interconnecting predetermined ones of the substantially parallel fluid channel sections to each other in order to obtain a fluid channel with a meandering shape.

8. The cooling element according to claim 3, wherein the cooling element comprises
a plurality of tubes having internal longitudinal walls which separate substantially parallel fluid channel sections from each other, and
a first fluid distribution element in a first end of the cooling element and a second fluid distribution element in a second end of the cooling element for providing the loops interconnecting predetermined ones of the substantially parallel fluid channel sections to each other in order to obtain a fluid channel with a meandering shape.

9. The cooling element according to claim 1, wherein the cooling element comprises
a plurality of tubes having internal longitudinal walls which separate substantially parallel fluid channel sections from each other;
a first fluid distribution element in a first end of the cooling element and a second fluid distribution element in a second end of the cooling element for providing the loops interconnecting predetermined ones of the substantially parallel fluid channel sections to each other in order to obtain a fluid channel with a meandering shape;
wherein the first evaporator is separated from the first condenser by at least a first additional condenser-evaporator pair in which the condenser cools fluid in the fluid channel and the evaporator receives heat from electric components and passes the heat into fluid in the fluid channel; and
wherein the first condenser and second condenser consists of fins extending between walls of the substantially parallel fluid channel sections for dissipating heat into surrounding air.

10. The cooling element according to claims 1, wherein the cooling element comprises a plurality of tubes; and wherein the tubes are extruded multiport tubes with parallel internal longitudinal walls separating the substantially parallel fluid channels sections from each other.

11. The cooling element according to claims 1,
wherein the cooling element comprises:
a plurality of tubes having internal longitudinal walls which separate substantially parallel fluid channel sections from each other;
a first fluid distribution element in a first end of the cooling element and a second fluid distribution element in a second end of the cooling element for providing the loops interconnecting predetermined ones of the substantially parallel fluid channel sections to each other in order to obtain a fluid channel with a meandering shape,
wherein the tubes are extruded multiport tubes with parallel internal longitudinal walls separating the substantially parallel fluid channels sections from each other;
wherein the first evaporator is separated from the first condenser by at least a first additional condenser-evaporator pair in which the condenser cools fluid in the fluid channel and the evaporator receives heat from electric components and passes the heat into fluid in the fluid channel; and
wherein the first condenser and second condenser consists of fins extending between walls of the substantially parallel fluid channel sections for dissipating heat into surrounding air.

* * * * *